United States Patent
Chang et al.

(10) Patent No.: US 10,520,992 B1
(45) Date of Patent: Dec. 31, 2019

(54) HINGE MODULE FOR A FOLDABLE TYPE DEVICE

(71) Applicant: Jarllytec Co., Ltd., New Taipei (TW)

(72) Inventors: Jui-Hung Chang, New Taipei (TW); Hsin-Chung Chang, New Taipei (TW)

(73) Assignee: JARLLYTEC CO., LTD., New Taipei (TW)

( * ) Notice: Subject to any disclaimer, the term of this patent is extended or adjusted under 35 U.S.C. 154(b) by 0 days.

(21) Appl. No.: 16/411,897

(22) Filed: May 14, 2019

(30) Foreign Application Priority Data

Dec. 6, 2018 (TW) .............................. 107143991 A

(51) Int. Cl.
G06F 1/16 (2006.01)
H05K 5/02 (2006.01)
G09F 9/30 (2006.01)

(52) U.S. Cl.
CPC .......... G06F 1/1681 (2013.01); G06F 1/1616 (2013.01); G06F 1/1652 (2013.01); H05K 5/0226 (2013.01); G09F 9/301 (2013.01)

(58) Field of Classification Search
CPC combination set(s) only.
See application file for complete search history.

(56) References Cited

U.S. PATENT DOCUMENTS 9,164,547 B1 * 10/2015 Kwon ................... G06F 1/1656
9,235,239 B2 * 1/2016 van Dijk ............... G06F 1/1652
9,250,733 B2 * 2/2016 Lee ......................... H04M 1/02
9,348,450 B1 * 5/2016 Kim ....................... G06F 1/1681
9,557,771 B2 * 1/2017 Park ....................... G06F 1/1641
9,625,947 B2 * 4/2017 Lee ...................... H04M 1/022
9,791,892 B2 10/2017 Park et al.
9,857,832 B2 * 1/2018 Kim ....................... G06F 1/1616
10,001,810 B2 * 6/2018 Yoo ....................... G06F 1/1626
10,416,726 B2 * 9/2019 Lin ....................... G06F 1/1656
2012/0264489 A1 * 10/2012 Choi ................... H04M 1/0216
455/566

(Continued)

FOREIGN PATENT DOCUMENTS

CN 103576775 A 2/2014
CN 105788452 A 7/2016

(Continued)

*Primary Examiner* — Lisa Lea-Edmonds
(74) *Attorney, Agent, or Firm* — Muncy, Geissler, Olds & Lowe, P.C.

(57) ABSTRACT

A hinge module for a foldable type device has one end-surface connected to a flexible display and has another end-surface respectively connected to a first housing and a second housing. The hinge module comprises a base and a first sliding mechanism. The first sliding mechanism comprises a first supporting plate, a first sliding cover, a first linkage rod, a linkage plate and at least one first restoring member. The first supporting plate and the linkage plate are respectively pivotally connected to the first-lateral-pivoting-portion and the first-central-pivoting-portion. A second limiting portion of a first sliding cover is used to limit the first limiting portion of the first supporting plate in a way of relatively sliding. Thus, when the first limiting portion slides relative to the second limiting portion, the first supporting plate is moved to accommodate the curved-central-part of the flexible display.

11 Claims, 7 Drawing Sheets

(56) References Cited

U.S. PATENT DOCUMENTS

| | | | |
|---|---|---|---|
| 2014/0247544 A1* | 9/2014 | Ryu | G09F 11/18 |
| | | | 361/679.01 |
| 2015/0241925 A1* | 8/2015 | Seo | G06F 1/1652 |
| | | | 361/679.27 |
| 2016/0378203 A1* | 12/2016 | Kim | G06F 1/1616 |
| | | | 345/156 |
| 2018/0210512 A1* | 7/2018 | Lin | G06F 1/1641 |

FOREIGN PATENT DOCUMENTS

| | | |
|---|---|---|
| CN | 106205385 A | 12/2016 |
| CN | 106255935 A | 12/2016 |
| CN | 103034293 B | 7/2018 |

* cited by examiner

Fig. 2

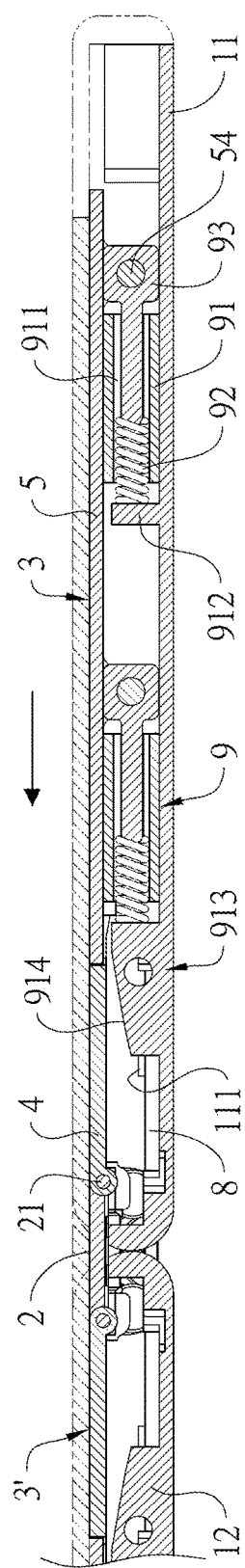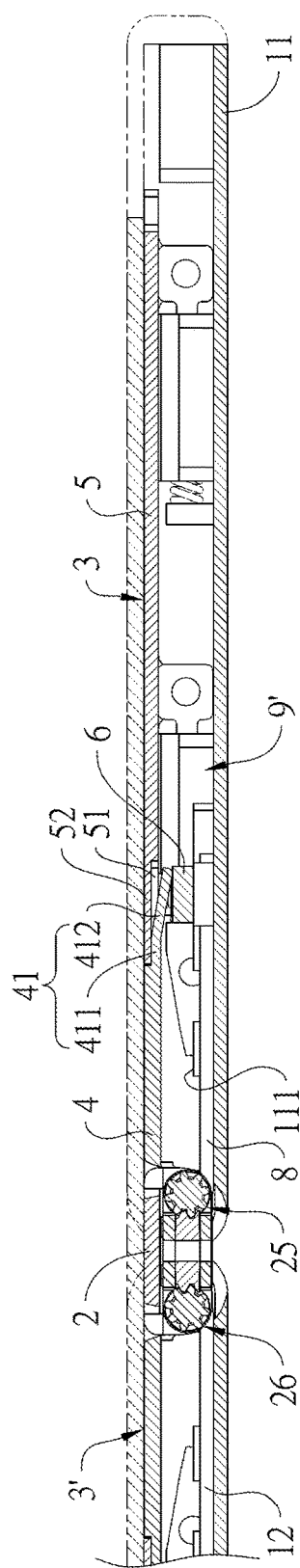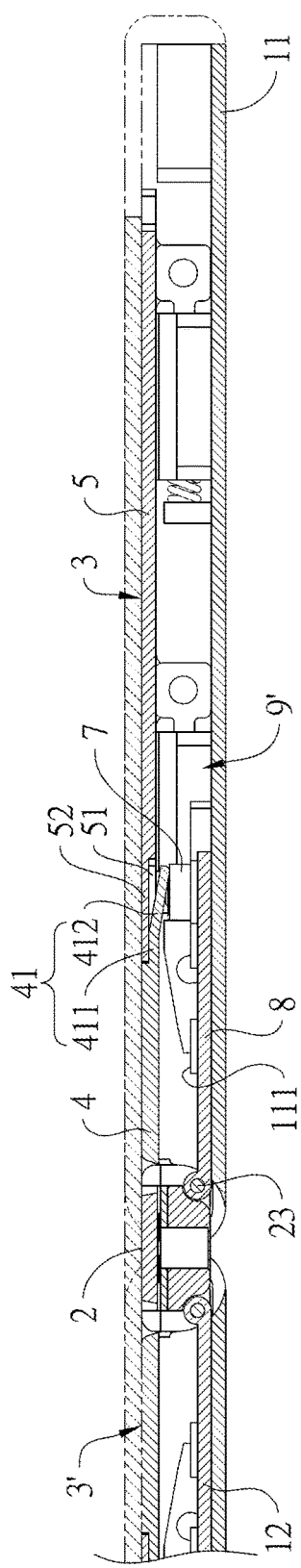

HINGE MODULE FOR A FOLDABLE TYPE DEVICE

FIELD OF THE INVENTION

The present invention relates to a hinge device, and more particularly to a hinge module for a foldable type electronic device.

BACKGROUND OF THE INVENTION

The conventional foldable electronic devices, such as the Chinese Patent entitled with "A Foldable display" with No. CN105788452A, this Chinese Patent has disclosed a foldable structure of a hinge, which mainly has a first body and a third body of the hinge respectively connected to a first supporting member and a second supporting member, and has the first supporting member and the second supporting member combined with a flexible display module. Thus, the flexible display module on the first supporting member and the second supporting member are folded after the first body and the third body are turned relative to the second body. Since it is necessary to provide a structure on the second body that allows the first and third bodies to turn, the spacing between the two bodies that can be reserved for the hinge cannot be effectively reduced. This structural design will make the overall volume larger, which is not only unfavorable to the overall design of the electronic device, but also does not meet the market requirement for the overall volume gradually to be lighter and thinner.

As shown in the three patents of CN103576775A, CN106205385A and U.S. Pat. No. 9,250,733B, the two bodies are formed in a relatively foldable manner by a biaxial shaft or an approximately biaxial-shaft structure. The "support structure" in these three patents has its one end therein pivoted through a "physical shaft" and the other end movable. When the entire "foldable device" is folded, each supporting structure in the two bodies is driven by another force exerting member, for example, spring, tension spring, magnetic iron, and torsion spring so as to form an accommodation space therein for accommodating the curved central part of the flexible display, and the unfolded central part of the flexible display is supported by the respective support structures when the entire foldable device is unfolded. Moreover, the Chinese Patent entitled with "A Foldable device" with No. CN106255935A and the Chinese Patent entitled with "A display System" with No. CN103034293B have disclosed that the linkage set is formed by one or two linkages to push "a support structure" pivoted by the "physical shaft" to produce movement, so as to achieve the effect of reducing the spacing to accommodate the "flexible portion of the flexible screen". The design concept of this "mechanism that can compensate for the folding path" is also shown in US patents "U.S. Pat. No. 9,791,892B" and "U.S. Ser. No. 10/001,810B", wherein the US patent "U.S. Pat. No. 9,791,892B" can be regarded as the extension of FIGS. 16a-16c of China patent "CN106255935A", while a mechanism that can compensate the folding path disclosed in the US patent "U.S. Ser. No. 10/001,810B" is provided in the bodies (220 of FIG. 2 and 920 of FIG. 9), comprising the translating plates (225 of FIG. 2 and 921 of FIG. 9), linkage assembly (330 of FIG. 2 and 920 of FIG. 9) or gear assembly (340 of FIG. 10a) together with guiding members (331 of FIG. 9 and 341 of FIG. 10a) so as to achieve the effect of compensating the difference produced from variety of the folding paths.

SUMMARY OF THE INVENTION

However, the connection and structures of the components of the "mechanism that compensates folding path" disclosed in the above patents are quite complicated, and most of them use a direct pivoting structure, which is not ideal in transmission stability. Moreover, such arrangement is easy to have the flexible display pulled or pushed due to the force produced from the folding process, causing wrinkles or peeling of the curved central part of the flexible display. In view of this, in order to provide a structure different from prior art and to improve the above disadvantages, the inventor has continuously research, and the present invention is provided.

An object of the present invention is to provide a hinge module capable of simplifying the used components for mechanism that compensates the folding path during the overall folding or unfolding process through connections and the structural features between the first sliding cover, the first linkage rod and the linkage plate, so as to reduce production costs and maintain the stability of the transmission.

One object of the present invention is to provide a hinge module, which can exert an elastic adjusting force by setting a structure having an oblong hole at least between the first linkage rod and the linkage plate, so as to avoid production of the force from the folding process on the flexible screen to cause the flexible screen pulled or pushed, thereby prolonging the life of the flexible display.

In order to fulfill above objects, the present invention provides a hinge module for a foldable type device, one end surface of which is connected to a flexible display simultaneously, so as to have the flexible display relatively folded, and the another end surface of which is respectively connected to a first housing and a second housing, so as to have the first housing and the second housing moved in a linkage way and to have the first housing and the second housing rotated in an opposite direction. The hinge module comprises a base and a first sliding mechanism, and one end of the base is provided with a first lateral pivoting portion and a first central pivoting portion. The first sliding mechanism comprises a first supporting plate, a first sliding cover, a first linkage rod, a linkage plate and at least one first restoring member. One end of the first supporting plate is pivotally connected to the first lateral pivoting portion, and another end of the first supporting plate is provided with a first limiting portion. One end of the first sliding cover is provided with a second limiting portion for limiting the first limiting portion in a way of relatively sliding, and one side of the first sliding cover is provided with a second lateral pivoting portion and a first connecting portion. A first linkage rod is provided with a first fulcrum, and the first fulcrum is pivotally connected to the first housing, and one end of the first linkage rod is connected to the second lateral pivoting portion. One end of the linkage plate is pivotally connected to the first central pivoting portion, and another end of the linkage plate is connected to another end of the first linkage rod. At least one first restoring member is respectively connected to the first connecting portion and the first housing. Thus, when the first sliding mechanism and the base are relatively rotated to have the first limiting portion and the second limiting portion relatively slid, the first supporting plate is moved by an angle to accommodate a curved part of the flexible display.

In an implementation, the first limiting portion includes a first extending plate and a second extending plate, and the first extending plate is a flat plate extended in a direction away from another end of the first supporting plate, and the second extending plate is an oblique plate extended in a direction away from one end of the first extending plate.

In an implementation, the second limiting portion is a groove formed at one end of the first sliding cover and provided with two lateral openings.

In an implementation, the second extending plate of the first limiting portion is clamped between the first sliding cover and the first linkage rod when the first housing and the second housing are unfolded in a way of rotating in an opposite direction.

In an implementation, another end of the linkage plate is provided with a first oblong hole for being passed through by a first shaft to be connected to another end of the first linkage rod.

In an implementation, the first restoring member includes a positioning block, a compression spring and a moving member, the positioning block is connected to the first housing, and the positioning block is provided with a positioning space therein for positioning the compression spring, one end of the moving member is inserted into the positioning space to press against the compression spring, and another end of the moving member is connected to the first connecting portion.

In an implementation, further comprising a limiting block, wherein the top of the limiting block is provided with a bevel for pressing against the first supporting plate when the first housing and the second housing are unfolded in a way of rotating in an opposite direction.

In an implementation, one end of the base is provided with a second lateral pivoting portion and a second central pivoting portion; and for the first sliding mechanism, one end of the first support plate is respectively pivotally connected to the first lateral pivoting portion and the second lateral pivoting portion; another side of the first sliding cover is provided with a third lateral pivoting portion and a second connecting portion; a second linkage rod is provided with a second fulcrum, wherein the second fulcrum is pivotally connected to the first housing, and one end of the second linkage rod is connected to the third lateral pivoting portion; one end of the linkage plate is respectively pivotally connected to the first central pivoting portion and the second central pivoting portion, and another end of the linkage plate is connected to another end of the second linkage rod; and at least one second restoring member is respectively connected to the second connecting portion and the first housing.

In an implementation, another end of the linkage plate is provided with a second oblong hole for being passed through by a second shaft to be connected to another end of the second linkage rod.

In an implementation, further comprising a second sliding mechanism, the second sliding mechanism and the first sliding mechanism is structurally corresponding to each other and are symmetrically provided at two ends of the base.

The present invention will be understood more fully by reference to the detailed description of the drawings and the preferred embodiments below.

BRIEF DESCRIPTION OF DRAWINGS

Figure 2:
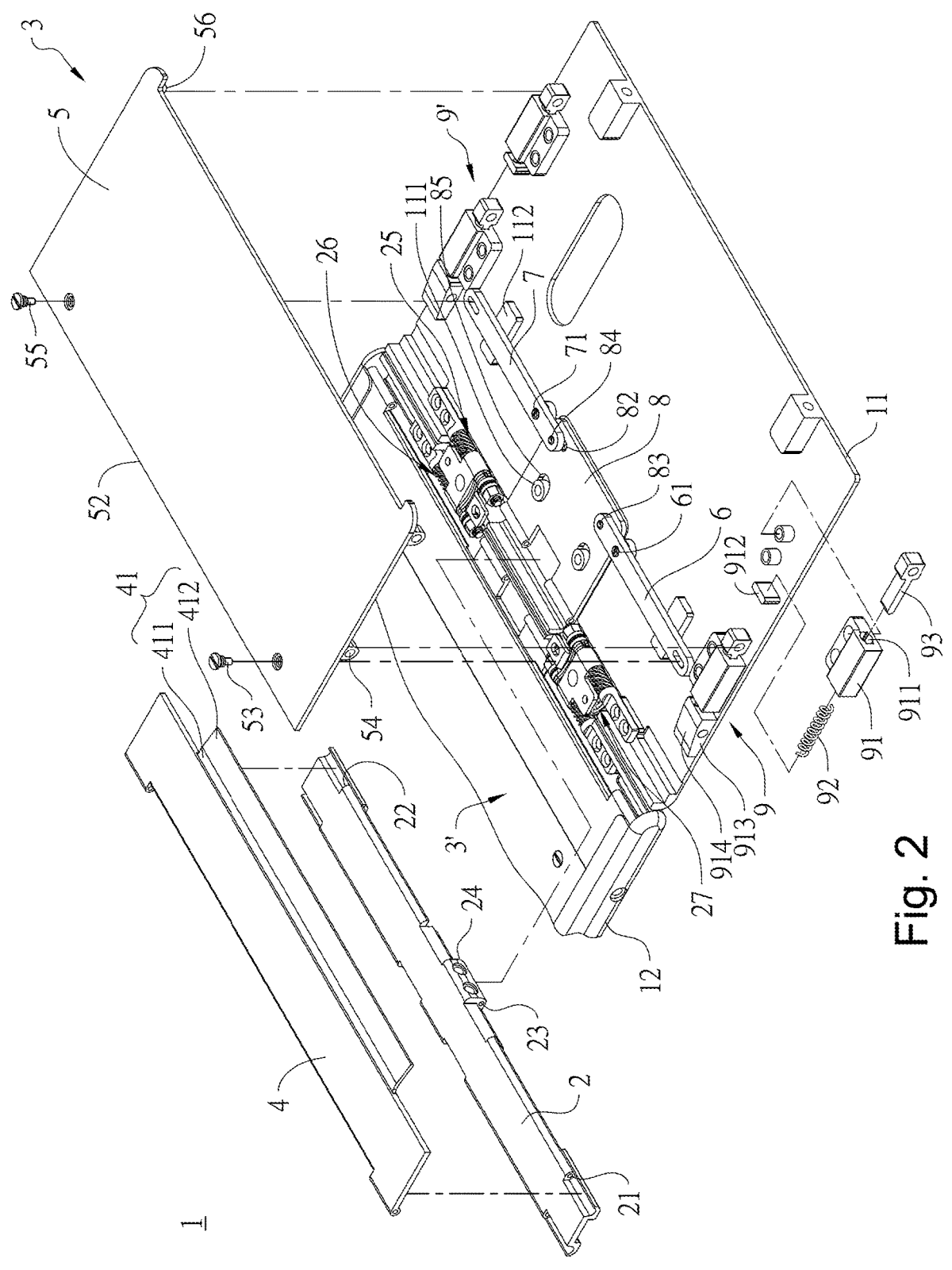

FIG. 2 is an exploded view showing a part of a preferred embodiment of the hinge module of the present invention.

FIG. 4 is a cross-sectional view taken along line A-A' of FIG. 3.

FIG. 5 is a cross-sectional view taken along line B-B' of FIG. 3.

FIG. 6 is a cross-sectional view taken along line C-C' of FIG. 3.

DETAILED DESCRIPTIONS OF PREFERRED EMBODIMENTS

Figure 1:
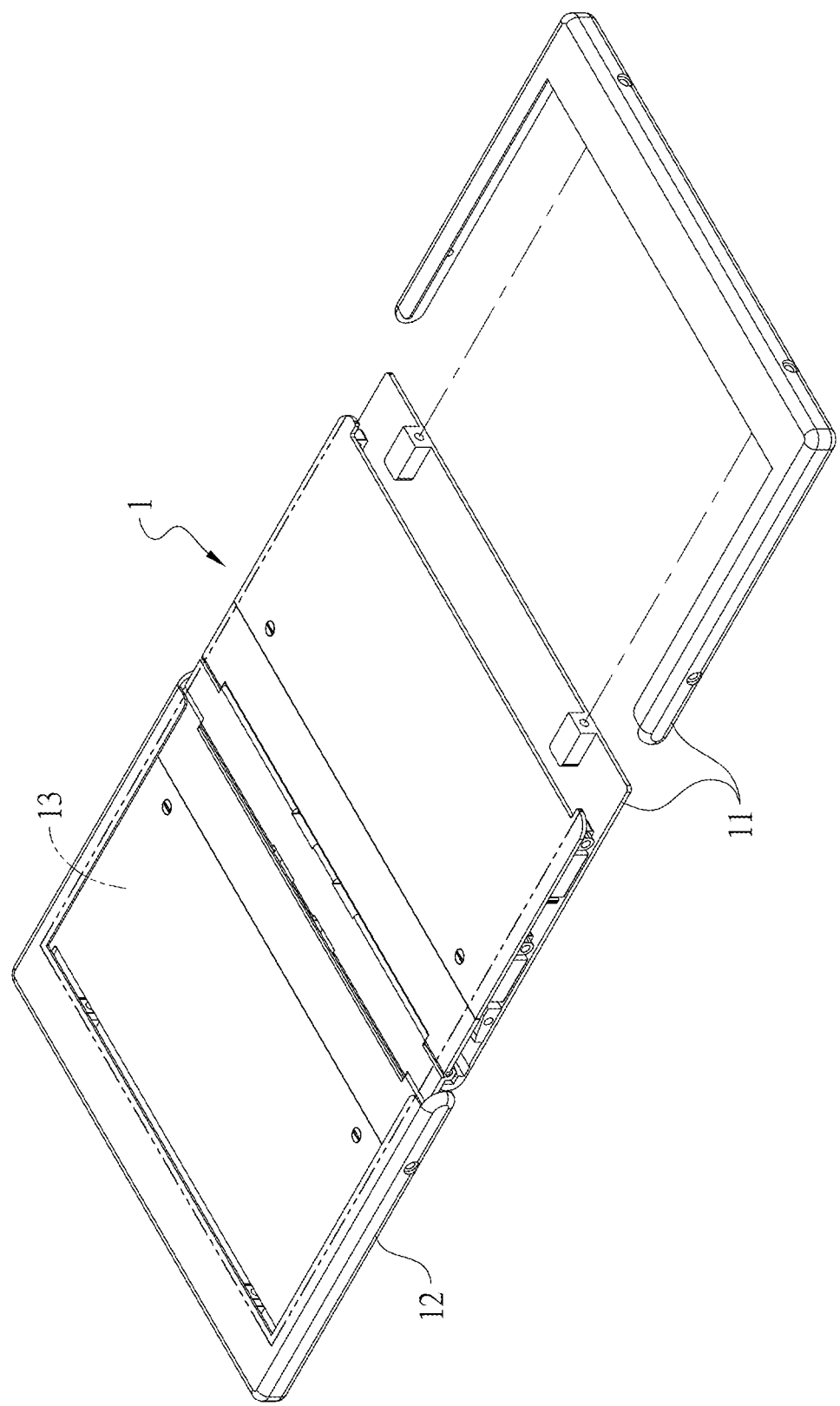
FIG. 1 is a perspective view showing a preferred embodiment of a hinge module of the present invention where the first housing is connected with the second housing.
Figure 3:
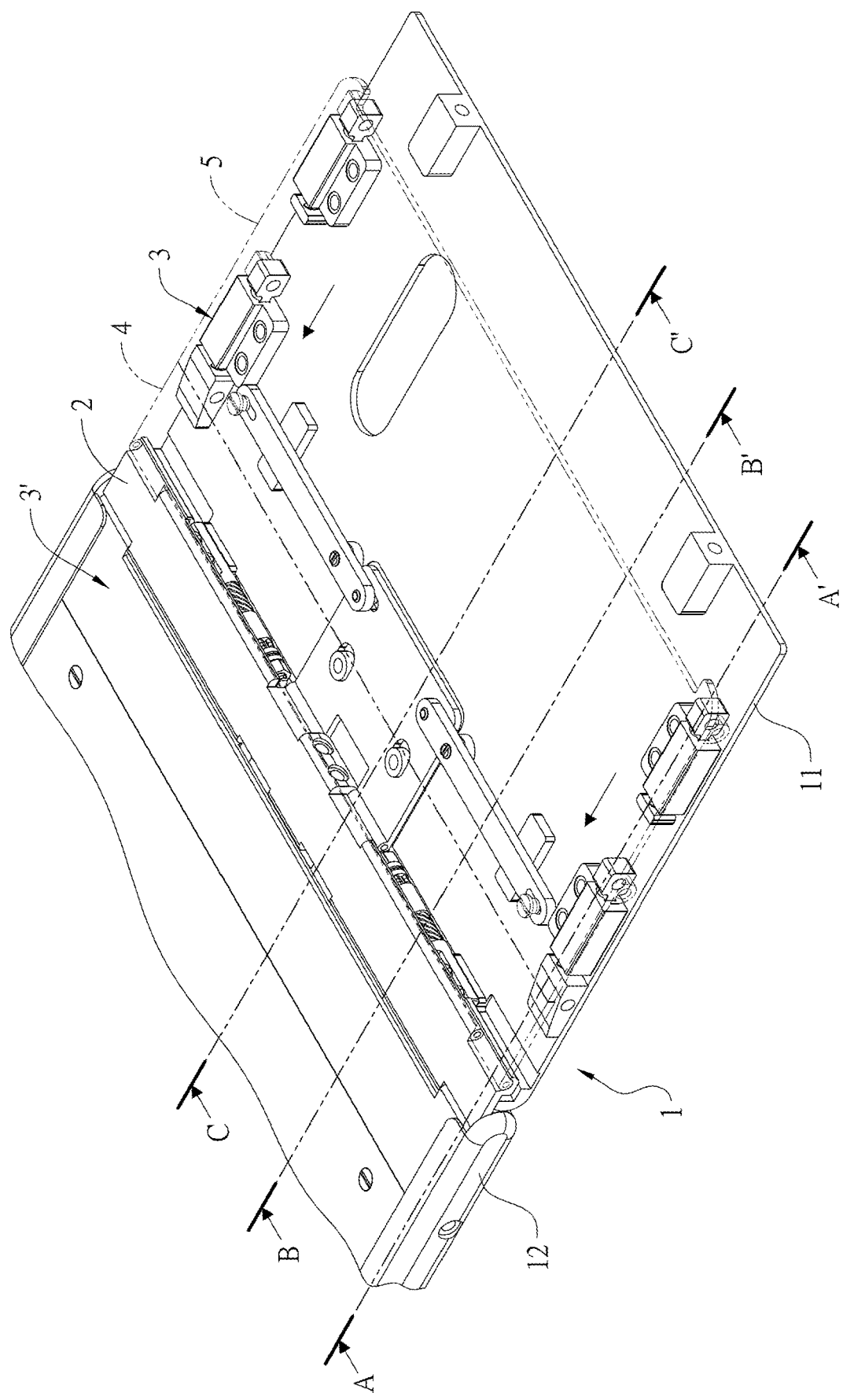
FIG. 3 is a perspective view of a preferred embodiment of the hinge module of the present invention.
Figure 7:
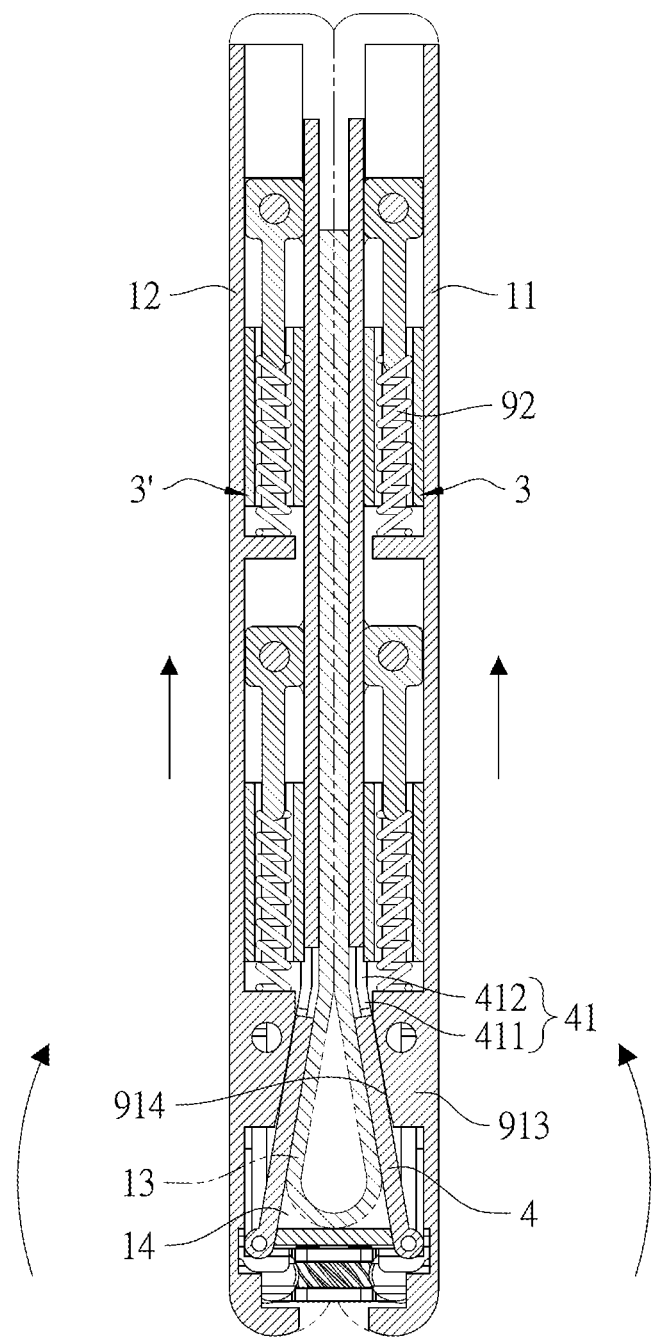
FIG. 7 is a cross-sectional view of the present invention of FIG. 4 when being folded.
Figure 8:
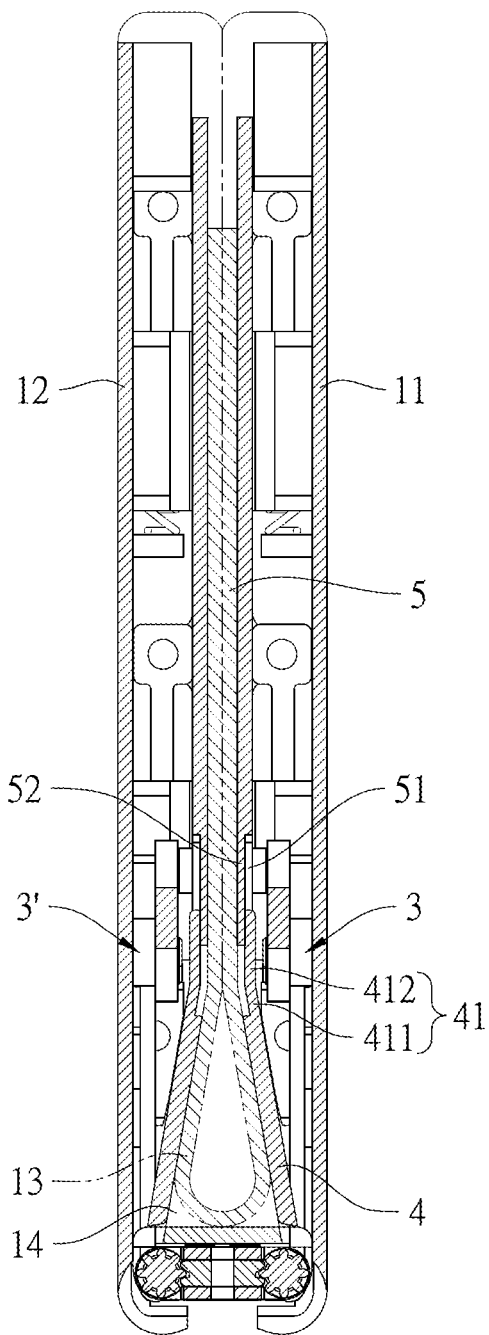
FIG. 8 is a cross-sectional view of the present invention of FIG. 5 when being folded.
Figure 9:
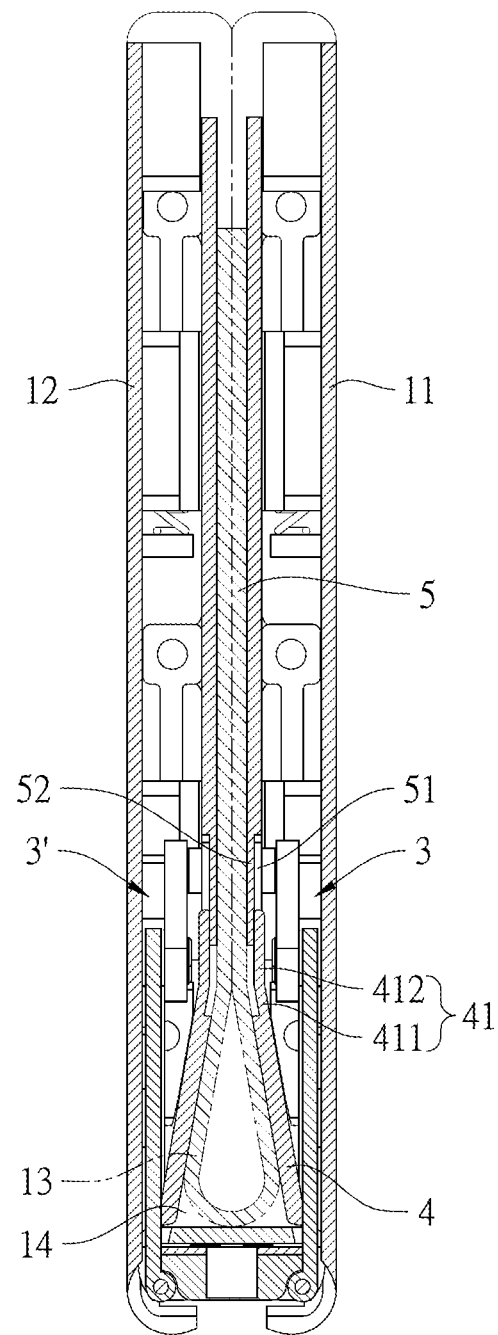
FIG. 9 is a cross-sectional view of the present invention of FIG. 6 when being folded.

Referring to FIG. 1, one end surface of the hinge module 1 for a foldable type device of the present invention is simultaneously connected to two halves of a flexible display 13, and another end surface of the hinge module 1 is respectively connected to a first housing 11 and a second housing 12 for moving the first housing 11 and the second housing 12 in a linkage way and to have the first housing 11 and the second housing 12 rotated in an opposite direction; so as to have the flexible display 13 be folded or unfolded, and when the device of the present invention is folded, as shown in FIG. 7, an accommodating space 14 is formed at the intersection of the first housing 11 and the second housing 12 to accommodate a curved central part of the flexible display 13.

As shown in FIGS. 2-6, the preferred embodiment of the hinge module 1 for a foldable type device of the present invention comprises a base 2, a first sliding mechanism 3 and a second sliding mechanism 3'. The base 2 is provided between the first housing 11 and the second housing 12, and one end of the base 2 has two sets of pivoting portions that are on different axes. One set of pivoting portions is a first lateral pivoting portion 21 and a second lateral pivoting portion 22 that are coaxial, and the other set of pivoting portion is a first central pivoting portion 23 and a second central pivoting portion 24 on another axis. Four pivoting holes opposite to the above each pivoting portions are provided at another end of the base 2. The first sliding mechanism 3 and the second sliding mechanism 3' are respectively pivotally connected to the two ends of the base 2, whereby the first sliding mechanism 3 and the second sliding mechanism 3' are provided symmetrically. In addition, the base 2 is provided with a first gear set 25 and a second gear set 26 therein, and the first gear set 25 is connected to the first housing 11, and the second gear set 26 is connected to the second housing 12, the first gear set 25 is engaged with the second gear set 26 by an central gear set 27. In one embodiment, the first gear set 25 and the second gear set 26 can also be engaged with each other in a linkage way to have the second sliding mechanism 3' and the first sliding mechanism 3 rotated in an opposite direction. In the present embodiment, the first sliding mechanism 3 and the second sliding mechanism 3' have the same structure, and the following description will be made by taking the first sliding mechanism 3 as an example.

The first sliding mechanism 3 comprises a first supporting plate 4, a first sliding cover 5, a first linkage rod 6, a second linkage rod 7, a linkage plate 8, and at least one first restoring member 9 and at least one second restoring member 9'. The first support plate 4 is an elongate flat plate. One end of the first supporting plate 4 is pivotally connected to the first lateral pivoting portion 21 and the second lateral pivoting portion 22 of the base 2. Another end of the first supporting plate 4 is provided with a first limiting portion 41 including a first extending plate 411 and a second extending plate 412. The first extending plate 411 is a flat plate extending in a direction away from another end of the first supporting plate 4. The second extending plate 412 is an oblique plate extending in a direction away from one end of the first extending plate 411. In addition, the plate surface of the first housing 11 is provided with two strip-shaped supporting blocks 112 that protrude upwardly and are parallel to each other, and the two strip-shaped supporting blocks 112 are laid along the moving paths of the first linkage rod 6 and the second linkage rod 7, so as to continuously support the rods during the simultaneous movement of the first linkage rod 6 and the second linkage rod 7 to prevent tilting or deformation.

The first sliding cover 5 is an elongated flat plate with its width substantially the same as the width of the first supporting plate 4. The first sliding cover 5 has one end adjacent to the first supporting plate 4 and is provided with a second limiting portion 51. The second limiting portion 51 is a groove formed at one end of the first sliding cover 5 and having two lateral openings, and the first sliding cover 5 adjacent to the groove forms a pressing piece 52, so that the first limiting portion 41 is limited in the second limiting portion 51 in a way of relatively sliding. One side of the first sliding cover 5 is provided with a second lateral pivoting portion 53 and two connecting blocks having connecting holes. The two connecting blocks are used as the first connecting portion 54 and another side of the first sliding cover 5 has a third lateral pivoting portion 55 and two connecting blocks having connecting holes. The two connecting blocks are used as the second connecting portion 56.

The first linkage rod 6 and the second linkage rod 7 are two elongated flat plates provided symmetrically, and the plate surfaces of the first linkage rod 6, the second linkage rod 7 and the first sliding cover 5 are parallel to each other. The first linkage rod 6 is provided with a first fulcrum 61, and the second linkage rod 7 is provided with a second fulcrum 71. The first fulcrum 61 and the second fulcrum 71 are pivotally connected to the plate surface of the first housing 11, respectively. One end of the linkage rod 6 and one end of the second linkage rod 7 are respectively provided with an elongated hole for respectively being connected to the second lateral pivoting portion 53 and the third lateral pivoting portion 55.

Figure 10:
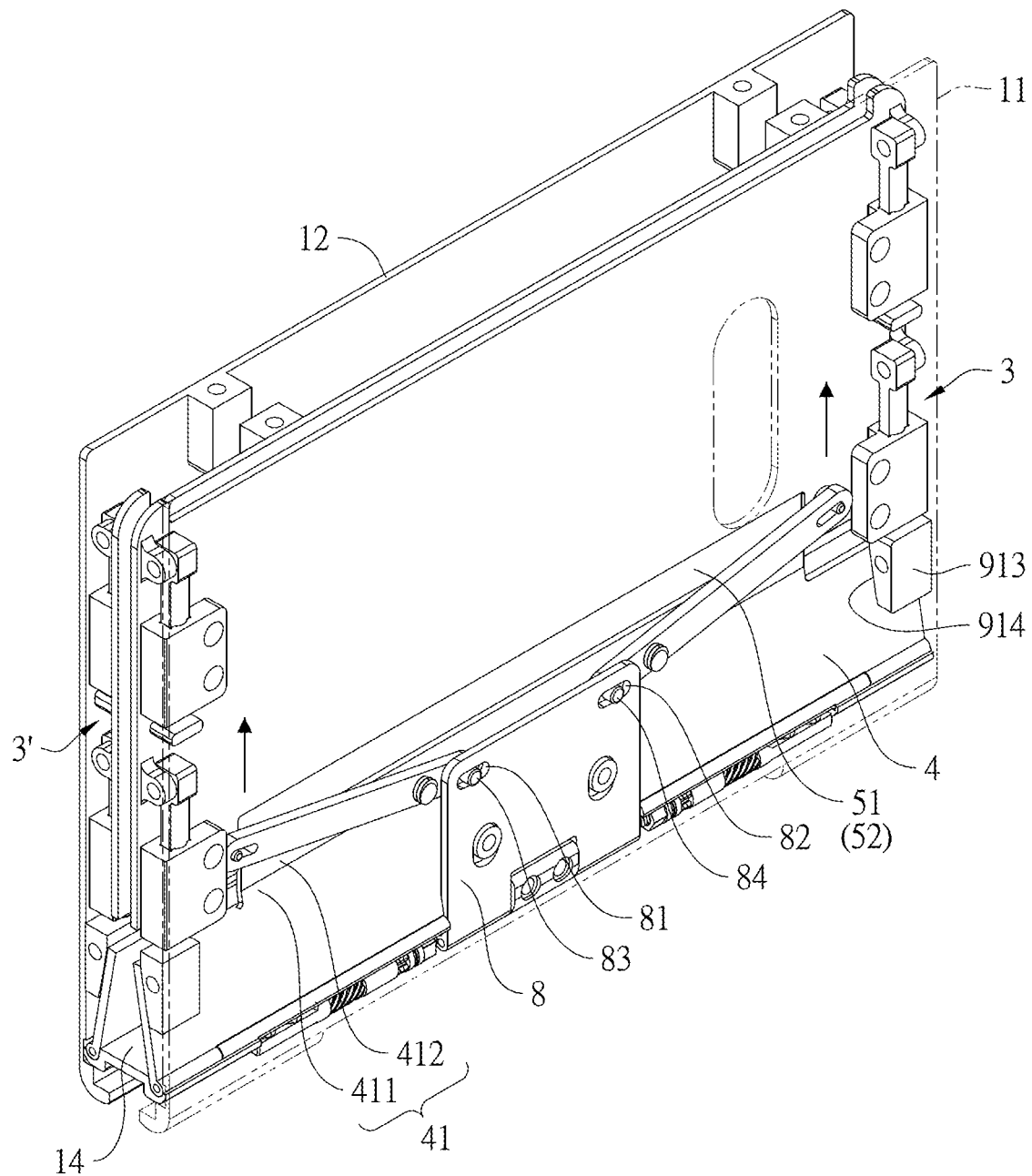
FIG. 10 is a perspective view showing a preferred embodiment of the hinge module of the present invention when being folded.

The linkage plate 8 is an elongated flat plate, the plate surfaces of the linkage plate 8 and the first sliding cover 5 are parallel to each other, and the first linkage rod 6 and the second linkage rod 7 are interposed between the linkage plate 8 and the first sliding cover 5. One end of the linking plate 8 is pivotally connected to the first central pivoting portion 23 and the second central pivoting portion 24 of the base 2, and another end of the linkage plate 8 is provided with a first oblong hole 81 and a second oblong holes 82 as shown in FIG. 10. A first shaft 83 passes through the first oblong hole 81 such that another end of the linkage plate 8 is connected to another end of the first linkage rod 6, and a second shaft 84 is passed through the second oblong hole 82, such that another end of the linkage plate 8 is connected to another end of the second linkage rod 7. In addition, the plate surface of the linkage plate 8 is provided with two guiding holes 85 that are parallel to each other thereon, and plate surface of the first housing 11 is provided with two guiding pillows 111 that protrude upwardly and respectively pass through the two guiding holes 85 for restricting the direction in which the linkage plate 8 is moved relative to the first housing 11.

The two first restoring members 9 and the two second restoring members 9' are symmetrically provided on two sides of the first housing 11. In this embodiment, the first restoring member 9 and the second restoring member 9' have the same structures. The first restoring member 9 includes a positioning block 91, a compression spring 92 and a moving member 93. The positioning block 91 is a rectangular block, and the bottom surface of the positioning block 91 is connected to the first housing 11. The positioning block 91 therein is provided with a positioning space 911 in the longitudinal direction to position the compression spring 92. In this embodiment, one end of the positioning block 91 is further provided with a blocking block 912 to block one end of the compression spring 92; one end of the moving member 93 is inserted into the positioning space 911 to press against another end of the compression spring 92, and another end the moving member 93 is connected to the first connecting portion 54 of the first sliding cover 5. In addition, the first restoring member 9 further includes a limiting block 913. The limiting block 913 is a rectangular block. One end of the limiting block 913 has a structure of the blocking block 912 for blocking one end of the compression spring 92. The top of limiting block 913 has a bevel 914.

Therefore, when the first housing 11 and the second housing 12 are rotated in an opposite direction and in an unfold state, the first limiting portion 41 of the first supporting plate 4 is accommodated in the second limiting portion 51 of the first sliding cover 5, the pressing piece 52 of the first sliding cover 5 presses downwardly on the first extending plate 411 of the first limiting portion 41, and the free end of the second extending plate 412 is pressed downwardly on the first linkage rod 6 and the second linkage rod 7, so as to have the second extending plate 412 interposed between the first sliding cover 5 and the first linkage rod 6 and the second linkage rod 7 to limit the movement of the first supporting plate 4, so as to supported upwardly the flexible display 13. At this time, the compression springs 92 of the first restoring member 9 and the second restoring member 9' are respectively compressed to store the elastic force.

As shown in FIGS. 7-10, when the first housing 11 and the second housing 12 are rotated in an opposite direction and in a folded state, the first limiting portion 41 of the first supporting plate 4 of the first sliding mechanism 3 is separated from the second limiting portion 51 of the first sliding cover 5 in a sliding way by the simultaneous movement of the first sliding mechanism 3 and the second sliding mechanism 3' and the elastic recovery of the two compression springs 92, such that the first extending plate 411 is free from the pressing piece 52, and the pressing piece 52 is pressed downwardly against the second extending plate 412, result in that the first supporting plate 4 is moved by an angle while pressing against the bevel 914 on the top of the limiting block 913. Since after the two first supporting plates 4 of the two sliding mechanisms are relatively moved by an angle, an accommodating space 14 is formed to accommodate the central curved portion of the flexible display 13.

Accordingly, the present invention has the following advantages:
1. In the folding process, according to the present invention, the first sliding cover and the linkage plate are continuously moved to generate displacement through the connection between the first sliding cover the first linkage rod, the second linkage rod and the linkage plate and structural features thereof, and compensation transitions for the traveling path and the length are formed during displacement and rotation to compensate the difference between the radius of curvature formed by the folded portion of the flexible display and the radius of curvature between the two housings. At the same time the two first supporting plates are moved in an opposite direction to accommodate the curved central part of the flexible display. Therefore, such arrangement can reduce the overall volume, which is advantageous for the design and meets the market requirement for being thinner, and such arrangement can effectively simplify the used components of "the mechanism for compensating folding traveling path" in the structure with reduced overall thickness, so as to reduce the production cost and maintain a stable transmission effect.

2. "Between the first linkage rod, the second linkage rod and the linkage plate" and "between the first linkage rod and the second linkage rod and the first sliding cover", according to the present invention, are respectively provided with a structure of an oblong hole for respectively being connected to "the first linkage rod, the second linkage rod and the linkage plate" and "the first linkage rod, the second linkage rod and the first sliding cover". Therefore, when the device of the present invention is folded, such arrangement can effectively form an elastic-adjusting force to prevent the flexible screen from pulling or pushing by the force of the folding or unfolding, so as to prolong the service life of the flexible display.

The description referred to in the drawings and stated above is only for the preferred embodiments of the present invention. Many equivalent variations and modifications can still be made by those skilled in the field of the present invention without departing from the spirit of the present invention, so they should be regarded to fall into the scope defined by the appended claims.

What is claimed is:

1. A hinge module for a foldable type device, one end surface of which is connected to a flexible display simultaneously, so as to have the flexible display relatively folded, and the another end surface of which is respectively connected to a first housing and a second housing, so as to have the first housing and the second housing moved in a linkage way and to have the first housing and the second housing rotated in an opposite direction; wherein the hinge module comprises a base and a first sliding mechanism, and one end of the base is provided with a first lateral pivoting portion and a first central pivoting portion; the first sliding mechanism comprises:

a first supporting plate, one end of which is pivotally connected to the first lateral pivoting portion, and another end of which is provided with a first limiting portion;
   a first sliding cover, one end of which is provided with a second limiting portion for limiting the first limiting portion in a way of relatively sliding, wherein one side of the first sliding cover is provided with a second lateral pivoting portion and a first connecting portion;
   a first linkage rod, provided with a first fulcrum, wherein the first fulcrum is pivotally connected to the first housing, and one end of the first linkage rod is connected to the second lateral pivoting portion;
   a linkage plate, one end of which is pivotally connected to the first central pivoting portion, and another end of which is connected to another end of the first linkage rod; and
   at least one first restoring member, respectively connected to the first connecting portion and the first housing.

2. The hinge module for a foldable type device according to claim 1, wherein the first limiting portion includes a first extending plate and a second extending plate, and the first extending plate is a flat plate extended in a direction away from another end of the first supporting plate, and the second extending plate is an oblique plate extended in a direction away from one end of the first extending plate.

3. The hinge module for a foldable type device according to claim 2, wherein the second limiting portion is a groove formed at one end of the first sliding cover and provided with two lateral openings.

4. The hinge module for a foldable type device according to claim 3, wherein the second extending plate of the first limiting portion is clamped between the first sliding cover and the first linkage rod when the first housing and the second housing are unfolded in a way of rotating in an opposite direction.

5. The hinge module for a foldable type device according to claim 1, wherein another end of the linkage plate is provided with a first oblong hole for being passed through by a first shaft to be connected to another end of the first linkage rod.

6. The hinge module for a foldable type device according to claim 1, wherein the first restoring member includes a positioning block, a compression spring and a moving member, the positioning block is connected to the first housing, and the positioning block is provided with a positioning space therein for positioning the compression spring, one end of the moving member is inserted into the positioning space to press against the compression spring, and another end of the moving member is connected to the first connecting portion.

7. The hinge module for a foldable type device according to claim 6, further comprising a limiting block, wherein the top of the limiting block is provided with a bevel for pressing against the first supporting plate when the first housing and the second housing are unfolded in a way of rotating in an opposite direction.

8. The hinge module for a foldable type device according to claim 1, wherein one end of the base is provided with a second lateral pivoting portion and a second central pivoting portion; and for the first sliding mechanism:

one end of the first support plate is respectively pivotally connected to the first lateral pivoting portion and the second lateral pivoting portion; another side of the first sliding cover is provided with a third lateral pivoting portion and a second connecting portion;
   a second linkage rod, provided with a second fulcrum, wherein the second fulcrum is pivotally connected to the first housing, and one end of the second linkage rod is connected to the third lateral pivoting portion;
   one end of the linkage plate is respectively pivotally connected to the first central pivoting portion and the second central pivoting portion, and another end of the linkage plate is connected to another end of the second linkage rod; and
   at least one second restoring member, respectively connected to the second connecting portion and the first housing.

9. The hinge module for a foldable type device according to claim 8, wherein another end of the linkage plate is provided with a second oblong hole for being passed through by a second shaft to be connected to another end of the second linkage rod.

10. The hinge module for a foldable type device according to claim 1, further comprising a second sliding mechanism, the second sliding mechanism and the first sliding mechanism is structurally corresponding to each other and are symmetrically provided at two ends of the base.

11. The hinge module for a foldable type device according to claim 8, further comprising a second sliding mechanism, the second sliding mechanism and the first sliding mechanism is structurally corresponding to each other and are symmetrically provided at two ends of the base.

\* \* \* \* \*